United States Patent
Ibrahim Mohamed et al.

(10) Patent No.: US 10,950,293 B2
(45) Date of Patent: Mar. 16, 2021

(54) SIGNAL PROCESSING CIRCUIT, DISTRIBUTED MEMORY, ROM, AND DAC WHICH SIGNAL PROCESSING CIRCUIT IS EMBEDDED

(71) Applicant: Nippon Telegraph and Telephone Corporation, Tokyo (JP)

(72) Inventors: Salaheldin Ahmed Ezzeldin Ibrahim Mohamed, Atsugi (JP); Youhei Sakamaki, Atsugi (JP); Shinsuke Nakano, Atsugi (JP); Kota Shikama, Atsugi (JP); Yuko Kawajiri, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 16/483,662

(22) PCT Filed: Apr. 19, 2018

(86) PCT No.: PCT/JP2018/016078
§ 371 (c)(1),
(2) Date: Aug. 5, 2019

(87) PCT Pub. No.: WO2018/194115
PCT Pub. Date: Oct. 25, 2018

(65) Prior Publication Data
US 2020/0135256 A1     Apr. 30, 2020

(30) Foreign Application Priority Data

Apr. 19, 2017   (JP) .............................. JP2017-083093

(51) Int. Cl.
*H03M 9/00*      (2006.01)
*G11C 11/408*    (2006.01)
(Continued)

(52) U.S. Cl.
CPC .............. *G11C 11/408* (2013.01); *G11C 8/10* (2013.01); *G11C 8/12* (2013.01); *G11C 17/10* (2013.01); *H03M 1/68* (2013.01)

(58) Field of Classification Search
CPC .......... G11C 11/408; G11C 8/10; G11C 8/12; H03M 1/68
(Continued)

(56) References Cited

U.S. PATENT DOCUMENTS

| 4,972,380 A | 11/1990 | Hidaka et al. |
| 5,103,426 A | 4/1992 | Hidaka et al. |

(Continued)

FOREIGN PATENT DOCUMENTS

| JP | 59-219008 A | 12/1984 |
| JP | 61-56469 A | 3/1986 |

(Continued)

OTHER PUBLICATIONS

International Search Report dated Jul. 10, 2018, issued in PCT Application No. PCT/JP2018/016078, filed Apr. 19, 2018.
(Continued)

*Primary Examiner* — Peguy Jean Pierre
(74) *Attorney, Agent, or Firm* — Workman Nydegger

(57) ABSTRACT

A signal processing circuit is provided that generates output signals to be output from spatially different output ports based on bit combinations of an input word consisting of a plurality of bit signals. A distributed memory, a ROM and a DAC in which the signal processing circuit is used are also provided. A recognition circuit includes a serial port to which a bit signal is input and $2^N$ output ports recognizing an input N-bit word and corresponding uniquely to $2^N$ bit combinations. Output ports of the recognition circuit are connected to $2^N$ input ports of an electric circuit. With no signal input to the recognition circuit, all outputs are con-
(Continued)

stantly in a Low level state. In a case where a bit signal is input to the serial port of the recognition circuit, only one of the output ports corresponding to the bit combinations turns to a High level state.

9 Claims, 16 Drawing Sheets

(51) Int. Cl.
*G11C 8/10* (2006.01)
*G11C 8/12* (2006.01)
*G11C 17/10* (2006.01)
*H03M 1/68* (2006.01)

(58) Field of Classification Search
USPC .................................................. 341/100, 137
See application file for complete search history.

(56) References Cited

U.S. PATENT DOCUMENTS

| | | | | |
|---|---|---|---|---|
| 5,226,100 | A * | 7/1993 | Maerz | G02B 6/12011 359/569 |
| 6,696,995 | B1 * | 2/2004 | Foley | H03M 9/00 341/100 |
| 8,755,112 | B2 * | 6/2014 | Stampoulidis | H01S 3/06737 359/341.3 |
| 9,235,065 | B1 | 1/2016 | Zortman | |
| 10,536,165 | B1 * | 1/2020 | Gaurav | H04J 1/085 |
| 2007/0047370 | A1 | 3/2007 | Hachmann | |
| 2009/0010090 | A1 | 1/2009 | Lloyd et al. | |
| 2012/0020174 | A1 | 1/2012 | Kuramori | |
| 2013/0314147 | A1 | 11/2013 | Shimizu et al. | |

FOREIGN PATENT DOCUMENTS

| | | |
|---|---|---|
| JP | 63-312656 A | 12/1988 |
| JP | 2012-27984 A | 2/2012 |
| JP | 59-22277 B1 | 4/2016 |
| JP | 59-37719 B1 | 5/2016 |
| WO | 2012-133519 A1 | 10/2012 |

OTHER PUBLICATIONS

International Preliminary Report on Patentability dated Oct. 31, 2019, issued in PCT Application No. PCT/JP2018/016078, filed Apr. 19, 2018.
Michael R. Watts et al., *Vertical Junction Silicon Microdisk Modulators and Switches*, Optics Express, vol. 19. No. 22, Oct. 24, 2011, pp. 21989-22003.
Ryan W. Going et al., *Germanium Gate PhotoMOSFET Integrated to Silicon Photonis*, IEEE Journal of Selected Topics in Quantum Electronics, vol. 20, No. 4, Jul./Aug. 2014, pp. 1-7.
Hiroshi Ishikawa et al., *A Parallel-to-Serial Converter Based on a Differentially-Operated Optically Clocked Transistor Array*, IEICE Electronics Express, vol. 10, No. 20, 2013, pp. 1-6.

* cited by examiner

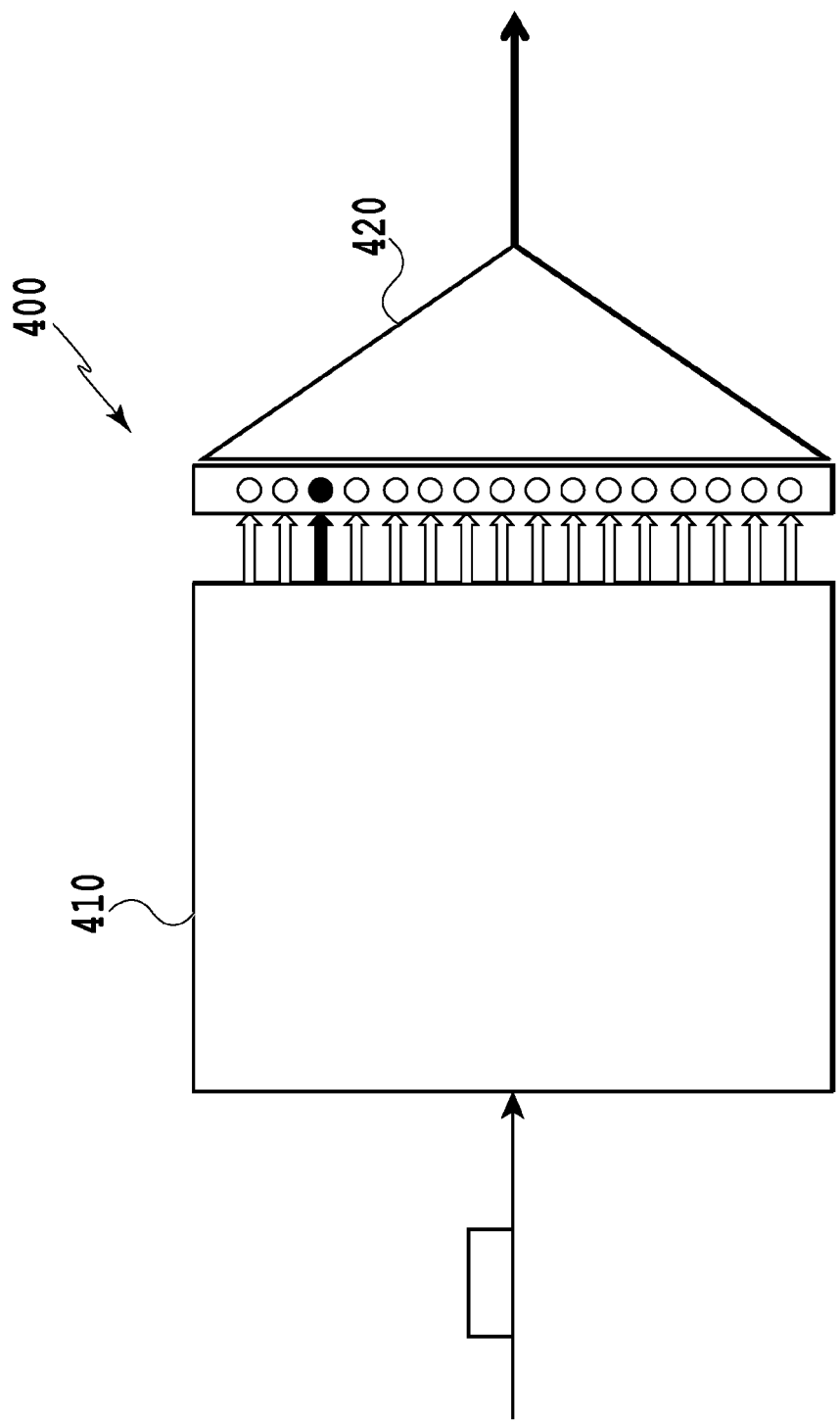

SIGNAL PROCESSING CIRCUIT, DISTRIBUTED MEMORY, ROM, AND DAC WHICH SIGNAL PROCESSING CIRCUIT IS EMBEDDED

TECHNICAL FIELD

The present invention relates to a signal processing circuit for recognizing a word of a plurality of bits, a distributed memory, a ROM and a DAC in which the signal processing circuit is embedded.

BACKGROUND ART

In order to deal with a substantial increase in demand for communication traffic, a data rate of a transmission system has been significantly increased. At present, a transmission system processing several-tens-of-gigabit to several-hundred-gigabit data per second is commonly required. The demand for a data transmission rate has drastically changed compared to the demand over the past 10 years.

Such a high speed data signals can be electrically transmitted only a short distance. However, using an optical carrier wave enables long-distance transmission so long as a band for an optical link and a reduced loss are maintained. These high-speed data signals transmitted as optical signals are converted at a receiving side into electric signals suitable for signal processing. Known bit-by-bit data processing is the only reliable method for electrically processing high-speed data signals. However, this is a factor hindering accomplishment of the objective to increase the transmission rate.

A method for serial-parallel conversion of high-data-rate bits is a common means for processing these bits using a low-speed electric circuit. FIG. 1 illustrates, by way of example, a serial-parallel converter 2 with N conversion channels. All bit signals input through a transmission line 1 to the serial-parallel converter 2 as optical signals constitute a succession of groups each constituted of N consecutive bit signals. The conversion channels of the serial-parallel converter 2 individually convert N bit signals included in one group into respective electric signals and subsequently similarly individually convert N bit signals included in a succeeding group into respective electric signals. In this manner, each of the conversion channel performs one operation for one group, and the bit signals output from each conversion channel are each extended by a factor of N. In other words, the speed of converted bit signals depend on the number of bits N and decreases with increasing N.

An output from each channel of the serial-parallel converter 2 has a slight time difference from an output from the preceding channel. The time difference leads to a delay in time of arrival at the first channel to be processed. The time difference can be corrected by a delay circuit by providing a progressively increasing delay to each of the channels starting with the last channel to be processed. This enables N converted bits to be simultaneously generated and allows all the bits to be input to a logical circuit 4 with a single latch signal simultaneously input to the logical circuit 4.

As described above, high-data-rate bit signals can be connected to a low-speed electric circuit by using the serial-parallel conversion method, and the speed of processing depends on the speed of the electric circuit. The processing speed of the electric circuit is mostly limited by transistors constituting the circuit. Silicon CMOS transistors are used for digital processing circuits as very reliable and energy-efficient transistors. For an increased speed of CMOS transistors, reducing the size of the transistor, particularly the width of a gate channel is effective.

CITATION LIST

Patent Literature

PTL 1: Japanese Patent No. 5922277
PTL 2: Japanese Patent No. 5937719

Non-Patent Literature

NPL 1: Michael R. Watts, William A. Zortman, Douglas C. Trotter, Ralph W. Young, and Anthony L. Lentine, "Vertical junction silicon microdisk modulators and switches," Opt. Express 19, 21989-22003, (2011).
NPL 2: R. W. Going, J. Loo, T. J. K. Liu and M. C. Wu, "Germanium Gate PhotoMOSFET Integrated to Silicon Photonics," in IEEE Journal of Selected Topics in Quantum Electronics, vol. 20, no. 4, pp. 1-7, July-August 2014.
NPL 3: Hiroshi Ishikawa, Tatsushi Nakahara, Hiroki Sugiyama and Ryo Takahashi, "A parallel-to-serial converter based on a differentially-operated optically clocked transistor array," IEICE Electronics Express, Vol. 10, No. 20, pp. 1-6, (2013).

SUMMARY OF INVENTION

However, as the size reduction approaches a physical limit, an increase in the speed of the transistor is more and more difficult. A geometric approach has reached the limit for several years, and much effort is now made to improve a technique for manufacturing transistors with an effective gate width of several nanometers. However, an increase in speed based on further miniaturization is not easy.

In view of these circumstances, an object of the present invention is to achieve an increased data transmission rate by improving a signal processing method instead of depending only on the speed of transistors. Specifically, this is achieved by providing a signal processing circuit generating output signals to be output from spatially different output ports based on bit combinations of an input word consisting of a plurality of bit signals, and also providing a distributed memory, a ROM and a DAC in which the signal processing circuit is embedded.

To accomplish the above-described object, an aspect of the present invention provides a signal processing circuit including one serial port to which an N-bit input word is input, $2^N$ first output ports corresponding uniquely to $2^N$ bit combinations and spatially separated from one another, and a recognition circuit including determination stages corresponding to the respective bits of the input word input through the serial port, the determination stages each including a determination unit configured to output, in a case where an electric pulse is input to the determination unit to activate the determination unit, the electric pulse to one of two second output ports according to a state of a corresponding bit of the input word, the two second output ports of the determination unit being connected to different determination units corresponding to an adjacent lower bit, the second output ports of the determination units corresponding to a lowest bit of the input word being connected to the first output ports.

Moreover, in another aspect of the present invention, the recognition circuit includes a serial-parallel converter, the serial-parallel converter generates and outputs, for each bit of the input word, a control signal indicative of a state of the bit to the determination unit corresponding to each bit, and the determination unit activated determines the state of the bit based on the control signal.

Moreover, in another aspect of the present invention, in the determination units corresponding to the lowest bit, a duration of an output electric pulse is set, for each of the output ports of the determination units, to have a predetermined temporal overlap with a predetermined observation period.

In another aspect of the present invention, the control signal is an optical pulse, and the determination unit includes: an optical resonance circuit configured to modulate the optical pulse by the electric pulse output from the determination unit corresponding to a higher bit and then deflect the optical pulse; an optical receiver circuit configured to generate a second electric pulse from the optical pulse deflected by the optical resonance circuit; and a logical circuit configured to determine the second output port outputting the electric pulse, based on the second electric pulse output from the optical receiver circuit.

Moreover, in another aspect of the present invention, the optical resonator circuit has a vertical-junction microdisk structure.

Moreover, in another aspect of the present invention, the optical receiver circuit is a discharge-based circuit including a Metal-Semiconductor-Metal (MSM) photodetector.

Another aspect of the present invention is a distributed memory including the signal processing circuit of the aspect of the present invention, $2^N$ RAM chips corresponding uniquely to the $2^N$ first output ports of the signal processing circuit and made active only in a case where an electric pulse is output from the first output port, and a signal separation circuit configured to receive an input address signal including a first portion of N bits and a second portion of M bits so that the signal processing circuit recognizes the first portion and the 2N RAM chips recognize the second portion.

Moreover, in another aspect of the present invention, the first portion and the second portion of the input address signal are separated from each other, the first portion is input to the signal processing circuit, and the second portion is input to the $2^N$ RAM chips.

In another aspect of the present invention, the input address signal is input both to the signal processing circuit and to the $2^N$ RAM chips, the signal processing circuit recognizes only the first portion of the input address signal, and the $2^N$ RAM chips recognize only the second portion of the input address signal using a gate pulse signal synchronizing with the second portion of the input address signal.

Another aspect of the present invention is a ROM including a first decoder and a second decoder each including the signal processing circuit of the aspect of the present invention and configured to decode a memory address from an input address signal, a memory cell array connected to the first and second decoders and including a plurality of two-dimensionally arranged memory cells corresponding to the memory address decoded, and an output sensor connected to each of the memory cells of the memory cell array and configured to output data from a memory cell designated by the first and second decoder.

Another aspect of the present invention is a DAC including the signal processing circuit of the aspect of the present invention, and an analog output voltage generator including $2^N$ input ports corresponding uniquely to the $2^N$ first output ports of the signal processing circuit, the $2^N$ input ports controlling generation of voltages at $2^N$ output voltage levels and causing the analog output voltage generator to generate a voltage at a predetermined voltage level only in a case where an electric pulse is output from the first output ports.

The present invention can generate output signals to be output from spatially different output ports based on bit combinations of an input word consisting of a plurality of ultrahigh-speed bit signals. A known bit-by-bit processing method using CMOS logical gates can only process input words in stages. However, the present invention can generate, at a speed corresponding to the processing speed of a CMOS, only one signal capable of recognizing bit combinations at a time, without reducing the speeds of individual bit signals. This allows the speed of final output processing to be increased without a need for an increase in the speed of transistors. Furthermore, the large-scale distributed memory, the ultrahigh-speed ROM, and the high-performance DAC can be implemented.

BRIEF DESCRIPTION OF DRAWINGS

FIG. 13 is a diagram illustrating a configuration of a high-performance digital analog converter (DAC) according to Embodiment 4 of the present invention.

DESCRIPTION OF EMBODIMENTS

Embodiments of the present invention will be described below in detail.

Embodiment 1

Figure 1:
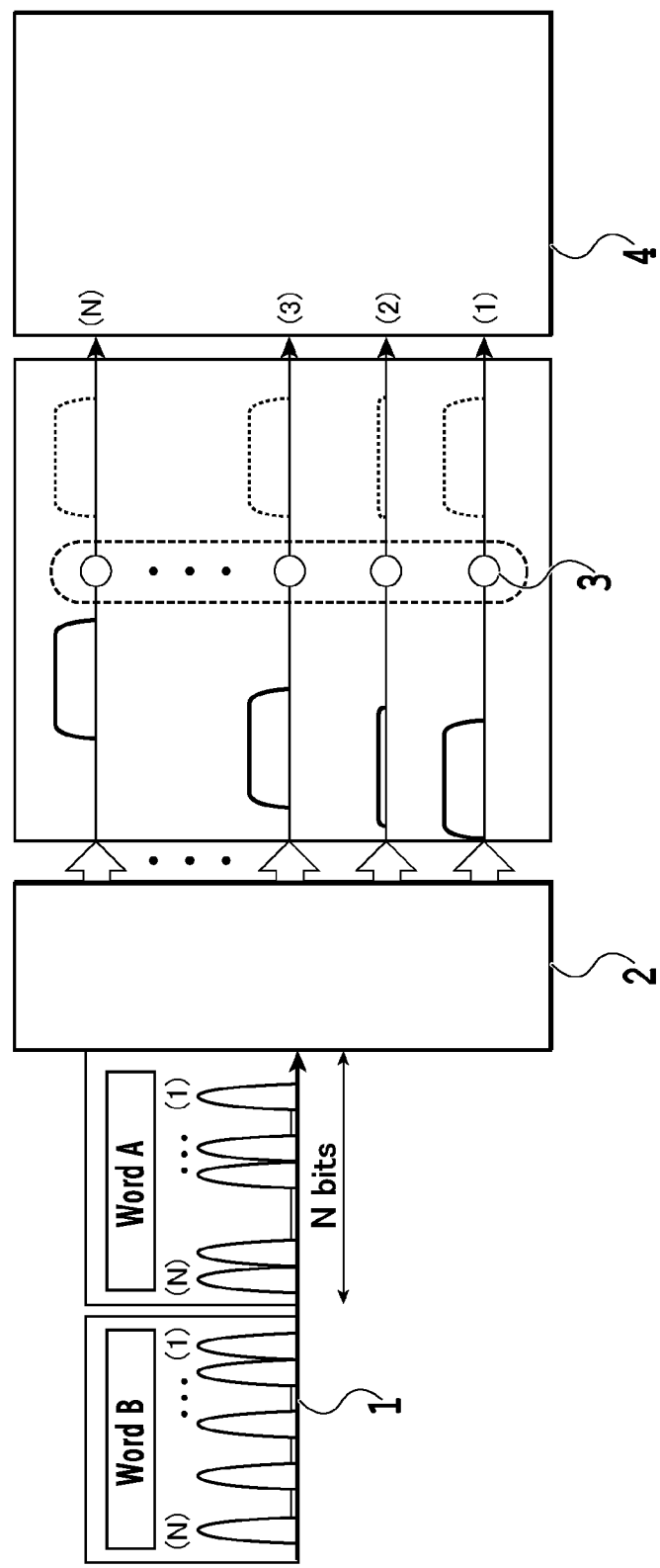
FIG. 1 is a diagram schematically illustrating processing of a serial-parallel converter with N conversion channels.
Figure 2A:
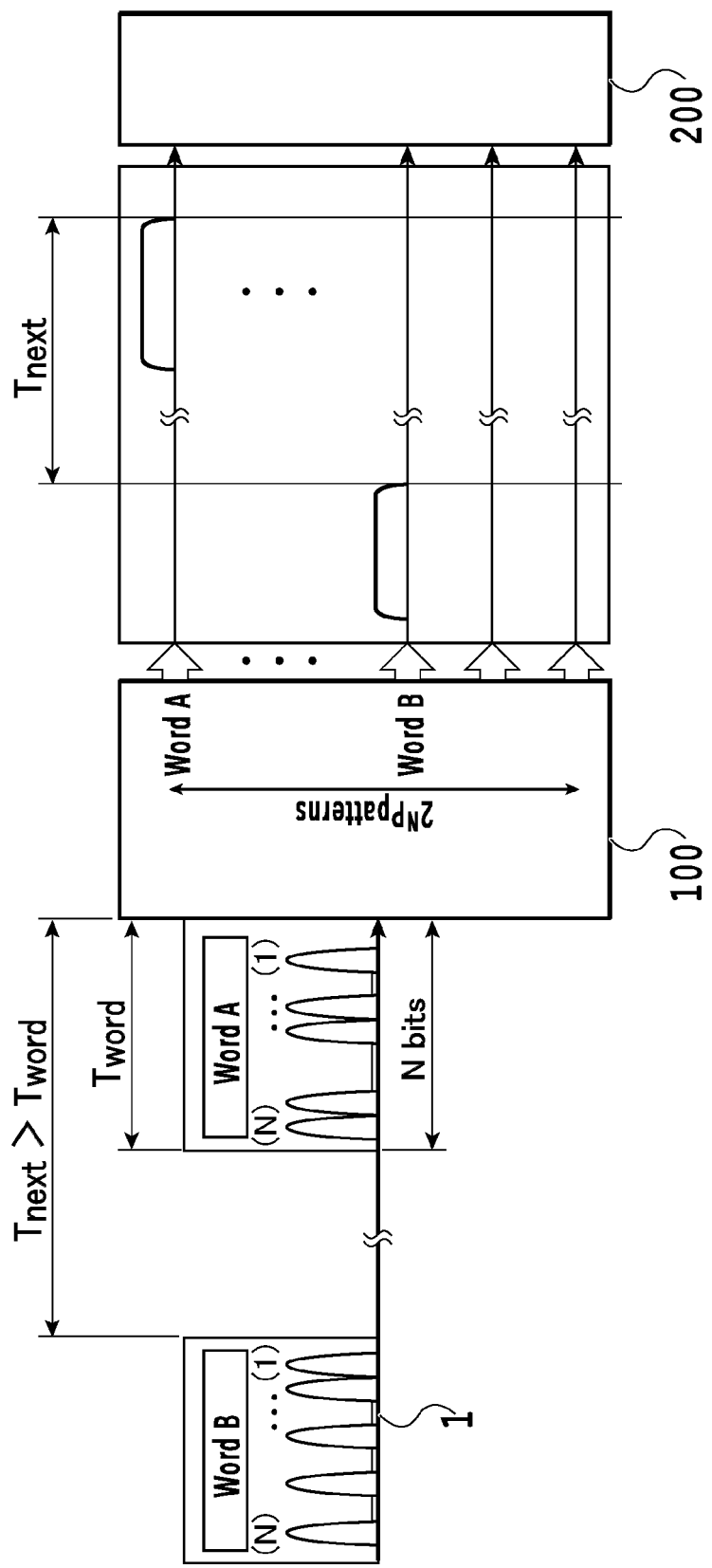
FIG. 2A is a diagram schematically illustrating a process executed on an input word with a consecutive-N-bit length by a recognition circuit according to an embodiment of the present invention.

FIG. 2A schematically illustrates a process executed on an input word with a consecutive-N-bit length by a recognition circuit 100 according to Embodiment 1 of the present invention. The recognition circuit 100 includes one serial port to which a high-speed bit signal is input and $2^N$ output ports recognizing an N-bit input word and corresponding uniquely to $2^N$ bit combinations. The output ports of the recognition circuit 100 are connected to 2N input ports of an electric circuit 200.

With no signal input to the serial port, all the outputs are constantly in a Low level state. In a case where bit signals constituting a word are input to the serial port of the recognition circuit 100, only one of the output ports corresponding to bit combination of the word turns to a High level state. The recognition circuit 100 operate in real time, and input of a N-bit word immediately turns the corresponding output port to the High level. The High level state is maintained for a duration sufficient to connect the output to a low-speed electric circuit.

Furthermore, the recognition circuit 100 supports two types of operation modes. In a case where the circuit is designed, one of the modes can be selected according to an application.

Figure 2B:
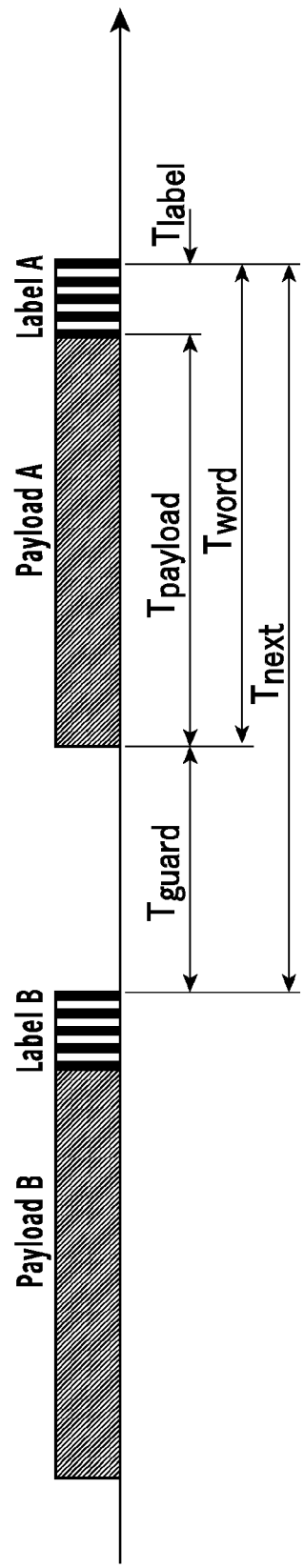
FIG. 2B is a diagram illustrating an input word corresponding to a burst mode.

A first mode is a "single and short-time operation" in which input words are separated from one another with long pauses between the words. As one form of the single and short-time operation, an example of a label recognizing process for a burst mode packet will be described. FIG. 2B illustrates input words compatible with the burst mode. As illustrated in FIG. 2B, each input word is constituted of a label and a succeeding payload and passes in a time $T_{word}$. An interval between the input words is set to a time $T_{next}$ longer than the passage time $T_{word}$ of each input word, and the input words are temporally separated from each other by a guard time $T_{guard}$. The recognition circuit 100 operates in a case of recognizing the label of the input word, and after this process, does not operate until the label of the next input word arrives after a payload passage time $T_{payload}$ and the guard time $T_{guard}$ elapse. Thus, an electric signal output at a final stage of the recognition circuit 100 can have a large permissible value for a reaction time.

Specifically, in a case where the label recognizing process for the burst mode packet as described above is executed at high speed, the output electric signal needs to rise rapidly but can fall slowly. This enables an increase in the degree of freedom in design of the signal processing circuit. On the other hand, in the first mode, the words are input at optional timings, and thus, a serial-parallel converting unit (110 in FIG. 3) of the recognition circuit 100 needs to be designed to support a burst mode operation.

A second mode is a "repeated operation" in which a plurality of consecutively input words are identified. As one form of the repeated operation, an example of a digital-analog conversion circuit (DAC) will be described. In a DAC, the recognition circuit 100 receives a sequence of consecutive bits, that is, a signal including no labels or guard times $T_{guard}$ but only consecutive payloads. The recognition circuit 100 repeats an operation of generating and outputting a single signal for every consecutive N bits. An output signal corresponding to every "N bits" is constrained within the duration of N bits. Thus, the final stage of the recognition circuit 100 needs to be designed to generate an electric signal with rapid falling edges. On the other hand, in the second mode, the recognition circuit 100 need not support the burst mode. Thus, in a case where the input bits are electric signals, the serial-parallel converting unit of the recognition circuit 100 can be configured using a known deserializer. The use of the known deserializer leads to a need for conversion of parallelized bit signals into optical pulses $C_{stage}$.

In the second mode, the maximum duration of output is equal to the duration for one input word, that is, the duration of one input bit signal multiplied by N. In the recognition circuit illustrated in FIG. 2A, for the number of bits N=8, the number of output ports of the circuit is $2^8$=256. In a case where two words with different bit combinations are consecutively input to the circuit, two output ports corresponding to the bit combinations of the respective words turn to the High level state.

Here, the recognition circuit 100 is assumed to process N consecutive high-speed bit signals. Execution of a serial-parallel conversion causes all the bit signals to be input to an electric circuit 300 at a reduced speed. The electric circuit processes the input N bit signals. In the related art, logical operations of the bit signals are performed with a plurality of clock cycles at a low speed. In contrast, in the present invention, without a need to reduce the speeds of the individual bit signals according to the processing speed of the electric circuit, output signals are generated at spatially separated output ports corresponding to the bit combination of the input word based on the bit combination. The duration of the signal output from each of the output ports corresponds to the duration for one word, that is, the duration for all the bit signals. The duration has a sufficient length to adapt to the speed of the low-speed electric circuit. In this case, the output ports to which the generated signals are output include aggregate information about all the bit signals, that is, information about the bit combination. Thus, compared to the related art, this configuration avoids consumption of clock cycles and allows processing in the electric circuit to be simplified.

This approach is more effective in processing a word of a plurality of consecutive N bits. It is assumed that a logical circuit performs operations on M words on which several logical operations need to be performed, the logical circuit being capable of converting each word into signals to be output to spatially different output ports according to the bit combination and processing resultant M consecutive low-speed signals.

As illustrated in FIG. 2A, the $2^N$ output ports of the recognition circuit 100 are connected to the electric circuit 200 constituting a logical circuit performing operations. Outputs corresponding to the M words are consecutively input to the electric circuit. The first input corresponds to the first processing result. The next input is processed using the preceding result, and is updated until all the operations are ended. This enables a reduction in processing time for ultrahigh-speed bits using the low-speed electric circuit, establishing a word-by-word processing scheme.

Figure 3:
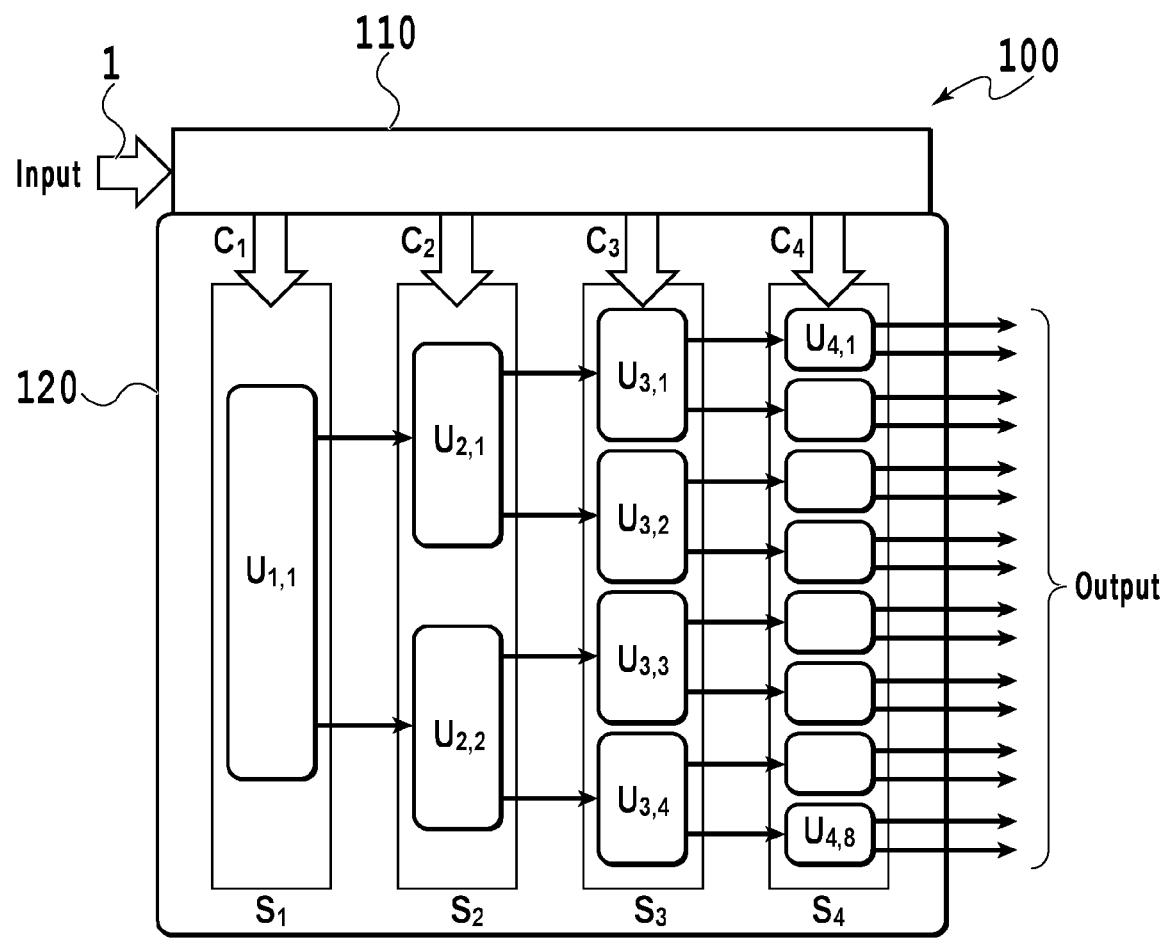
FIG. 3 is a diagram schematically illustrating a configuration of a recognition circuit capable of processing a 4-bit word according to an embodiment of the present invention.

Embodiments of the present invention will be described below with reference to the drawings. FIG. 3 schematically illustrates a configuration of the recognition circuit 100 capable of processing a 4-bit word. The recognition circuit 100 according to an embodiment of the present invention is constituted of two main functional blocks: the serial-parallel converter 110 and a determination circuit 120. An output from each conversion channel of the serial-parallel converter 110 controls a predetermined determination stage S of the determination circuit 120.

The most significant, highest bit determines whether the final output is less than 8 or larger than or equal to 8 depending on whether the highest bit is in the High level state or in the Low level state. Accordingly, determination of the value of the highest bit allows candidates for the possible value of the final output to be reduced to half. For the remaining candidates for the value, determination of the state of the next highest bit allows the candidates to be reduced to half. In other words, the candidates for the value of the final output can be narrowed down to quarter. By repeating this procedure down to the lowest bit, the word can be converted into the correct outputs with the possibility of inappropriate outputs consecutively excluded. That is, the output from the output port corresponding to the bit combination of the word can exclusively be brought into the High level state. Thus, the determination circuit 120 is configured as described below.

A determination stage S1 includes one determination unit $U_{1,1}$. A determination stage S2 corresponding to a bit that is one bit lower than the highest bit includes two determination units $U_{2,1}$, $U_{2,2}$. A determination stage S3 corresponding to a bit that is two bits lower than the highest bit includes four determination units $U_{3,1}$ to $U_{3,4}$. A determination stage S4 corresponding to the lowest bit includes eight determination units $U_{4,1}$ to $U_{4,8}$.

For the two output ports of the determination unit $U_{1,1}$ in the determination unit S1 corresponding to the highest bit, one of the output ports is connected to the determination unit $U_{2,1}$ of the determination stage S2 corresponding to the second highest bit. The other output port is connected to the determination unit $U_{2,2}$. Similarly, the four output ports of the determination units $U_{2,1}$, $U_{2,2}$ of the determination unit S2 are connected to the four determination unit $U_{3,1}$ to $U_{3,4}$ of the determination stage S3 corresponding to the third highest bit. The eight output ports of the determination units $U_{3,1}$, to $U_{3,4}$ of the determination unit S3 are connected to the eight determination units $U_{4,1}$ to $U_{4,8}$ of the determination stage S4 corresponding to the lowest bit.

The determination unit $U_{1,1}$ of the first determination stage S1 sets one of the two output ports to the High level based on a control signal C1 generated by the conversion channel of the serial-parallel converter 110 converting the highest bit signal. In a case where one of the outputs of the determination unit $U_{1,1}$ is set to the High level, one of the two determination units $U_{2,1}$, $U_{2,2}$ of the second determination stage S2 is activated. The activated determination unit $U_{2,1}$ or $U_{2,2}$ sets one of the two output ports to the High level based on a control signal C2 generated by the conversion channel of the serial-parallel converter 110 converting the second highest bit signal. These processes set, to the High level, only one of the four output ports from which the second determination stage S2 can select and an output signal is generated at an output port spatially separated from one another. This narrows down the possibility of the final output to quarter. Similarly, a High level signal from the second determination stage S2 activates one of the four determination units $U_{3,1}$ to $U_{3,4}$ of the third determination stage S3. The activated one of the determination units $U_{3,4}$ or $U_{3,4}$ sets one of the two output ports to the High level based on a control signal C3 generated by the conversion channel of the serial-parallel converter 110 converting the third highest bit signal. Any one of the eight determination units $U_{4,1}$ to $U_{4,8}$ of the fourth determination stage S4 is also activated by a High level signal from the third determination stage S3. One of the two output ports is thus set to the High level based on a control signal C4 generated by the conversion channel of the serial-parallel converter 110 converting the lowest bit signal.

Figure 4:
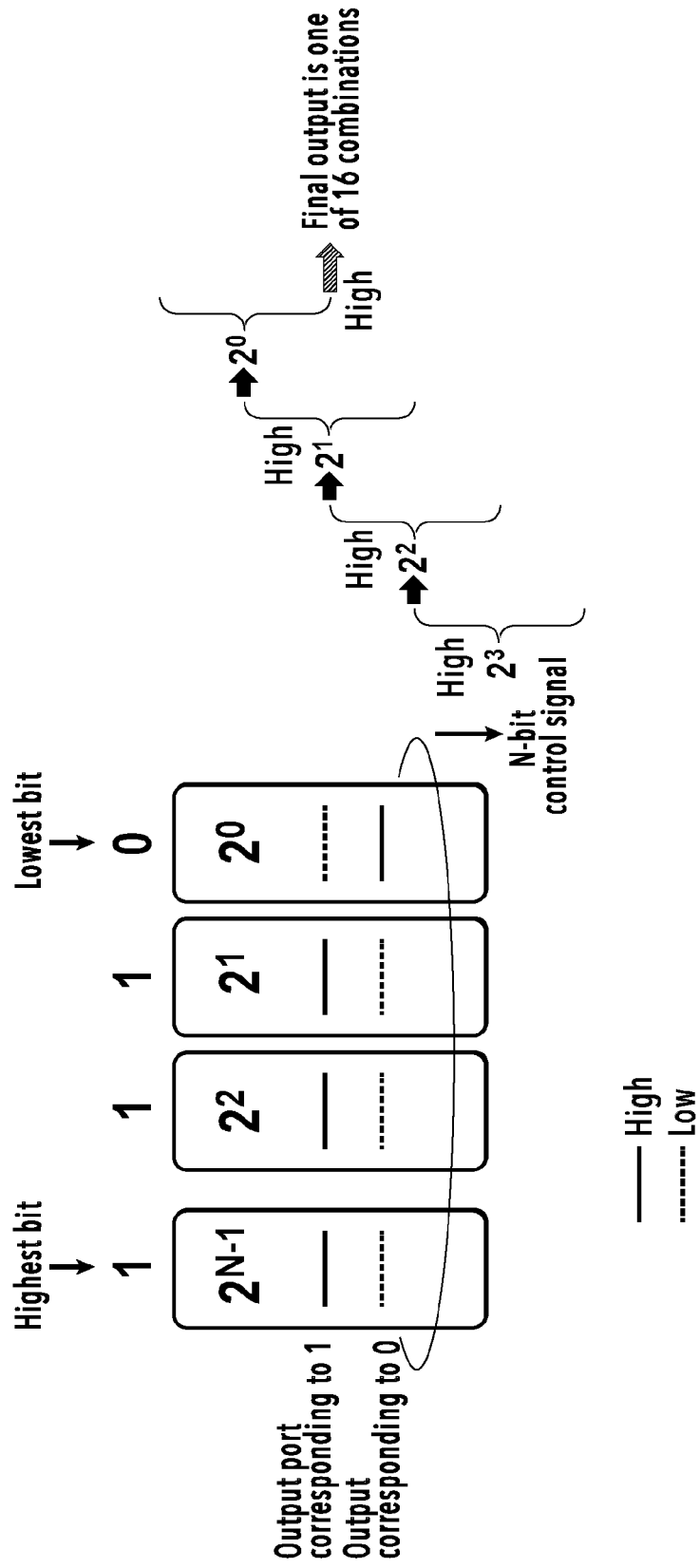
FIG. 4 is a diagram illustrating a method for associating an input word expressed in 4 bits with an output expressed as a decimal.

In this manner, one of the 16 output ports corresponding to the bit combinations of the 4-bit word can be set to the High level. For example, in a case the 4-bit word "1110" illustrated in FIG. 4 is input to the recognition circuit 100, different combinations of binaries can be associated with "14", one of decimal integers 0 to 15.

The recognition circuit 100 of the present invention is not limited to the above-described processing of the 4-bit word. Also for an N-bit word with optional bit combinations, similar repetition of the above-described procedure allows only the output from the output port corresponding to the bit combination of each word to be brought into the High level state. In this case, the serial-parallel converter 110 includes N conversion channels corresponding to the bits constituting the word, and the determination circuit 120 includes N determination stages $S_1$ to $S_N$ corresponding to the N conversion channels of the serial-parallel converter 110.

Of the N determination stages $S_1$ to $S_N$, the determination stage $S_1$ corresponding to the highest bit is assumed to be the first stage. Then, the (N-i)-th determination stage $S_{(N-s)}$ corresponding to a bit in the place of $2^s$ (s=0, 1, 2, ..., N−1) includes $2^{N-1-s}$ determination units U. The N-th determination stage $S_N$ is constituted of $2^{N-1}$ determination units $U_{N-s,1}$ to $U_{N-s,t}$ (t=$2^{N-1}$).

Each determination unit U includes two output ports, and the output ports are connected to different determination units U in a next lower determination stage S on one-to-one basis. Only one of the determination units U is activated. In each determination stage S, a High level output from a next higher determination stage activates only one determination unit U.

The determination units U belonging to the same determination stage S are connected in parallel to the same conversion channel of the serial-parallel converter 110. The output from the activated determination unit U is controlled by the control signal C generated by the conversion channel of the serial-parallel converter corresponding to the determination stage S to which the determination unit U belongs. In a case where the control signal C is in the High level state, only one of the ports of the activated determination unit U turns to the High level. In a case where the converted bit signal is at the Low level, then only the other port turns to the High level.

In this manner, only one of the outputs of one of the determination units U belonging to each determination stage S turns to the High level. Among the $2^N$ output ports of the determination units $U_{N-s,1}$ to $U_{N-s,t}$ (t=$2^{N-1}$) of the N-th determination stage $S^N$, one output port corresponding to the bit combination of the N-bit word can be set to the High level as the final output of the recognition circuit 100.

Figure 5:
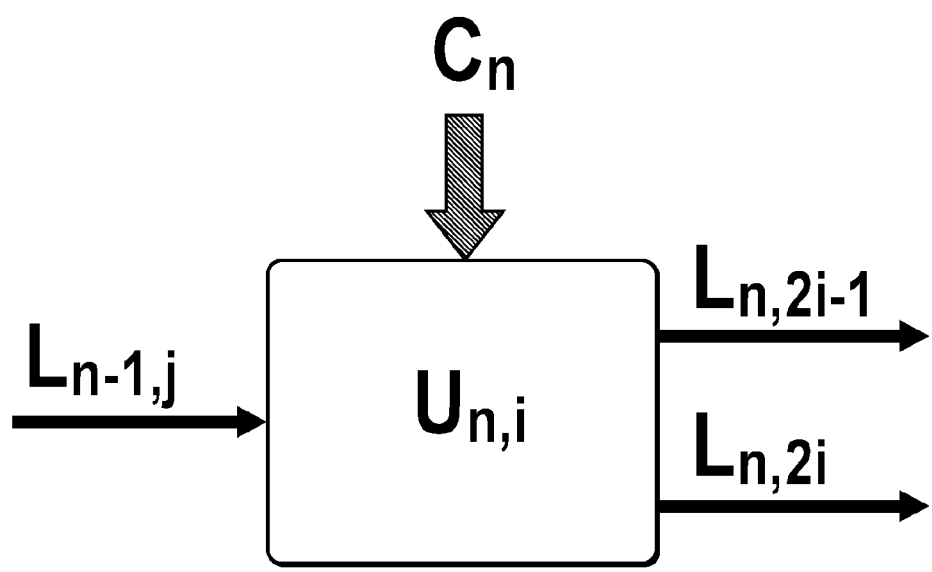
FIG. 5 is a diagram schematically illustrating an i-th determination unit $U_{n,i}$ belonging to a generalized determination stage Sn and included in a recognition circuit according to an embodiment of the present invention.

Now, circuit operations will be described in a chronological order. FIG. 5 illustrates an i-th determination unit $U_{n,i}$ belonging to a generalized determination stage Sn. Two inputs are provided to the determination unit $U_{n,1}$. The first input $L_{n-1,j}$ (j=(i+1)/2 in a case where i is an odd number and j=i/2 in a case where i is an even number) is input from the determination unit U belonging to a determination stage S(n−1). The second input is a control signal Cn generated by the n-th conversion channel from the conversion channel corresponding to the highest bit of the serial-parallel converter 110. The second input controls all the determination units U in the n-th determination stage Sn. In a case where the bit signal to be converted by the n-th conversion channel of the serial-parallel converter 110 is at the Low level, the control signal Cn generated is also at the Low level. Similarly, in a case where the bit signal is at the High level, the control signal Cn is also at the High level.

The determination unit $U_{n,1}$ outputs one of spatially different two signals $L_{n,1i-1}$ and $L_{n,2i}$. The output from the determination unit $U_{n,1}$ is determined by the control signal Cn and the signal $L_{n-1,j}$ input from the preceding determination unit. Normally, the signal $L_{n-1,j}$ starts slightly earlier than the control signal Cn, and the output signal $L_{n,2i}$ is temporarily turns to the High level. Subsequently, the control signal Cn is generated. In a case where the control signal Cn is at the Low level, the output signal $L_{n,2i}$ remains at the High level until a duration designated for the output signal $L_{n,2i}$ ends. On the other hand, in a case where the control signal Cn is at the High level, the output signal $L_{n,2i}$ immediately returns to the Low level, an $L_{n,2i-1}$ remains at the High level until a duration designated for $L_{n,2i-1}$ ends.

Figure 6:
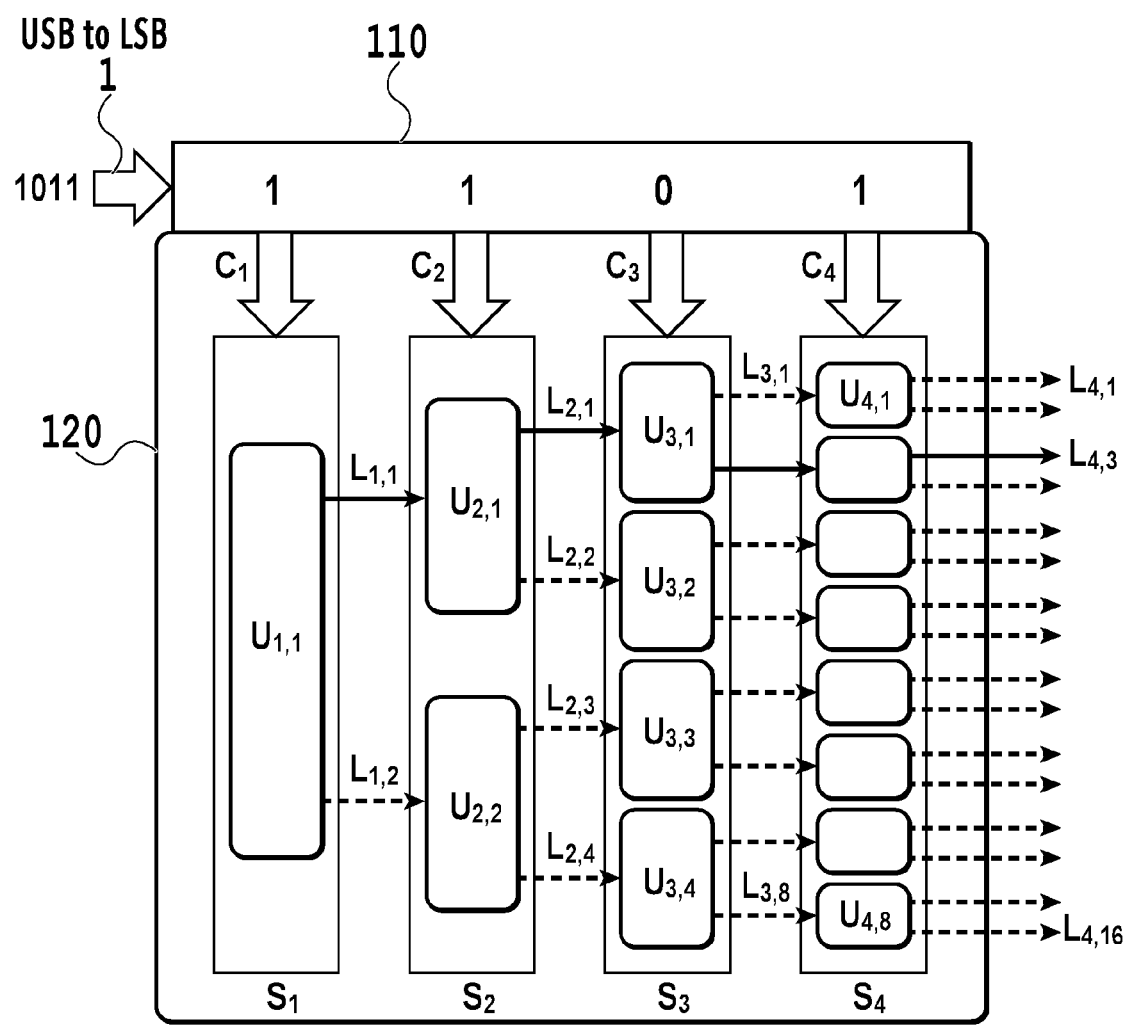
FIG. 6 is a diagram schematically illustrating a configuration of a recognition circuit according to an embodiment of the present invention, the recognition circuit processing a 4-bit input word having a sequence of "1101" on a time sequence.
Figure 7:
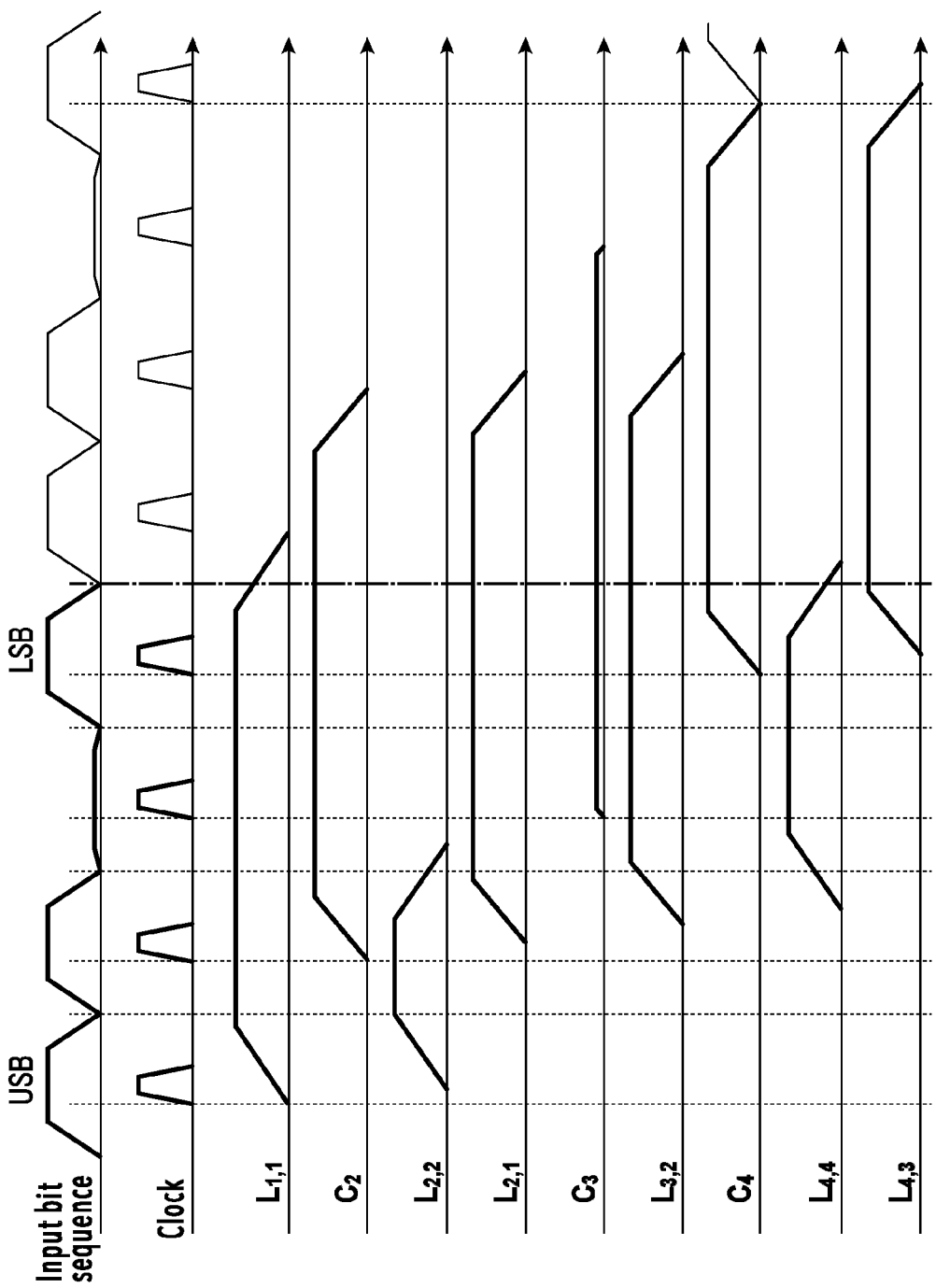
FIG. 7 is a time sequence diagram simplified for description of a signal generation sequence in a recognition circuit according to an embodiment of the present invention in a case where a 4-bit input word having a sequence of "1101" on the time sequence is processed in the recognition circuit.

FIG. 6 illustrates an example of a recognition circuit processing a 4-bit input word with a sequence of "1101" on a time sequence. Furthermore, FIG. 7 illustrates a simplified time sequence diagram illustrating a signal generation sequence in the recognition circuit 100 processing the 4-bit input word with the sequence of "1101" on the time sequence. For description, a series of clock pulses is illustrated, and a time instance is illustrated in which a new control signal is enabled after a new bit signal is converted by a different conversion channel of the serial-parallel converter 110.

The control signal C1 determines only the output from the unit $U_{1,1}$. In the present example, the highest bit is at the High level, and thus, a signal $L_{1,1}$ is converted into the High level. On the other hand, a signal $L_{1,2}$ remains at the Low level, which corresponds to a steady state. In the present circuit, the duration of the signal $L_{1,1}$ is set to 4T (T: clock cycle time) in view of repeated operations. In a case where a new word arrives after the time 4T, the output from the unit $U_{1,1}$ can be freely determined again. An important function for the output from each unit is a sufficiently short rising time, which is essential for the operations in the entire circuit.

In a case where the signal $L_{1,1}$ turns to the High level, a signal $L_{2,2}$ correspondingly turns to the High level. However, the control signal C2 generated at the High level resets the signal $L_{2,2}$ and instead sets the signal $L_{2,1}$ to the High level. Here, in a case where the third highest bit is Low, the control signal C3 turns to the Low level, and a signal $L_{3,2}$ remains at the High level after being initialized by the signal $L_{2,1}$. After the control signal C4 is generated, a signal $L_{4,3}$ turns to the High level to generate the final output of the circuit.

In the predetermined stage Sn, with reference to the time of a clock pulse Kn, an output start time at this stage varies. In the example, the signal $L_{3,2}$ starts before the control signal C3 is generated. However, in a case where the third highest bit signal turns to the high level (in the present example, the converted bit signal is at the low level), the control signal $L_{3,1}$ turns to the high level and starts slightly later than the signal C3. In a case where the output start thus varies at each stage, the duration of the signal is affected at the final output of the circuit.

Figure 8:
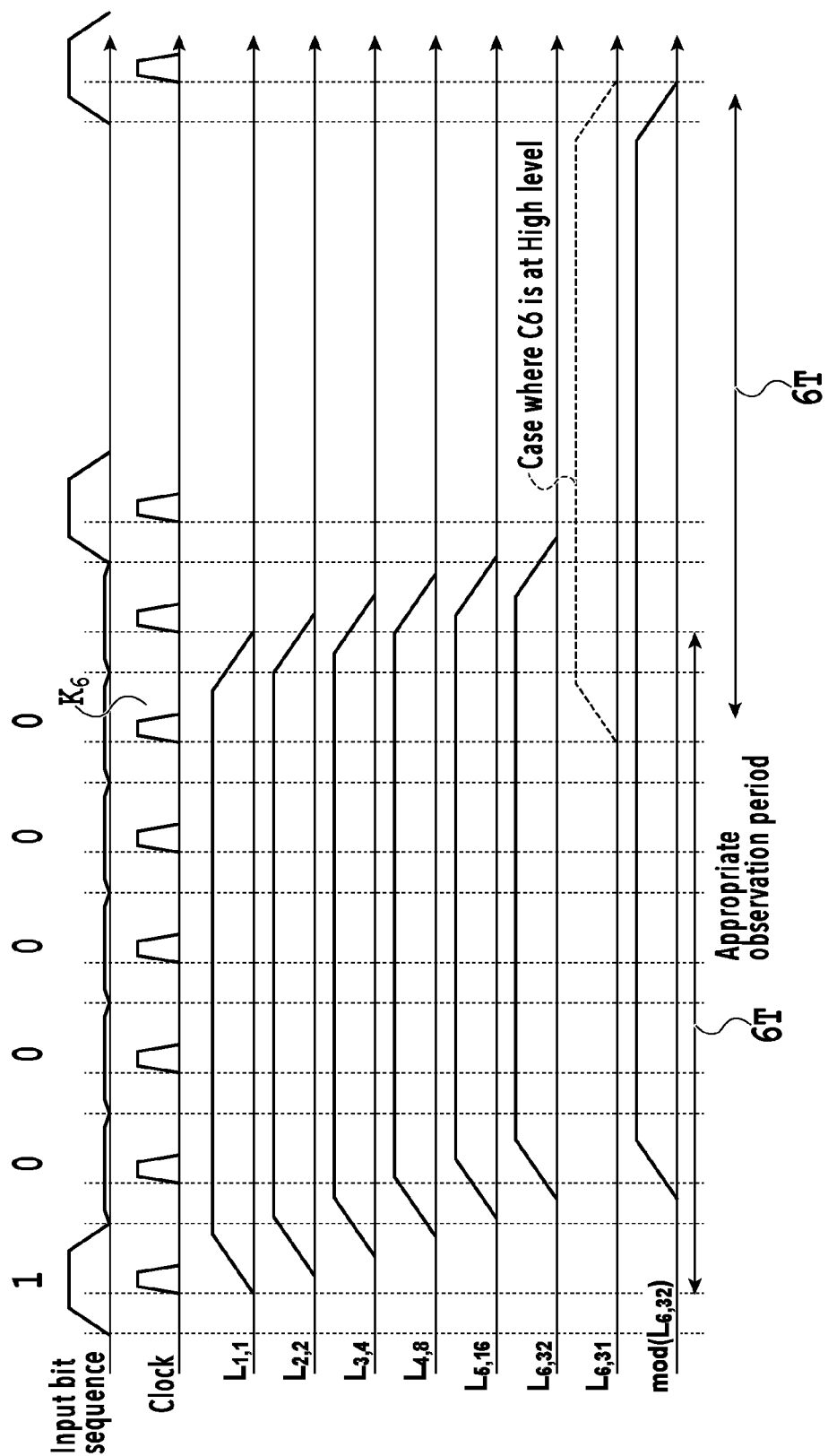
FIG. 8 is a time sequence diagram simplified for description of a signal generation sequence in a recognition circuit according to an embodiment of the present invention in a case where a 6-bit input word having a sequence of "100000" on the time sequence is processed in the recognition circuit.

FIG. 8 illustrates a simplified time sequence diagram illustrating a signal generation sequence in the recognition circuit 100 processing a 6-bit input word with a sequence of "100000" on the time sequence. In this example, six bits with the sequence of "100000" on the time sequence are processed. Importantly, in the repeated operation mode, observing the final output after the last clock pulse $K_6$ and during a period 6T is most appropriate. In this example, the final output is $L_{6,32}$, and all the control signals input to determination units lower than the unit $U_{2,1}$ are at the Low level. Consequently, in each unit lower than the unit $U_{2,1}$, the output signal $L_{n,2i}$ turns to the High level before the clock pulse at each stage, and remains at the High level instead of being reset. Thus, the final output signal $L_{6,32}$ starts considerably earlier than the start of the last clock pulse $K_6$. Accordingly, the final output signal significantly deviates from the appropriate observation period. FIG. 8 illustrates the output signal $L_{6,31}$ by a dotted line in a case where the control signal $C_6$ is high. A comparison between the output signals $L_{6,32}$ and $L_{6,31}$ indicates that $L_{6,32}$ includes a smaller overlap with the appropriate observation period than $L_{6,31}$. This problem can be solved by focusing on the fact that a route from the first stage to the final determination unit is uniquely determined by the input word. For each route, it is possible to predetermine a difference in the start time of the final signal and an insufficient overlap with the appropriate observation period. Thus, each route is adjustably designed such that the duration of the output signal from the determination unit at the final stage of the route overlaps the above-described appropriate observation period. The adjusted output signal in the determination stage designed as described above is illustrated as mod($L_{6,32}$) in FIG. 8.

As described above, the signal generated at each determination stage S is used to control only one of the determination units U at the next determination stage. That is, the signal needs to move a very small number (probably one or two) transistors while preventing a possible electric load hampering fast operations. Furthermore, to enable processing of high-speed electric signals in such a configuration, a lumped circuit needs to be designed to have dimensions sufficient to accommodate a signal speed during the processing. On the other hand, each control signal emitted to a particular determination stage S by the serial-parallel converter 110 needs to be applicable to all the determination units belonging to the determination stage. In electrical terms, the control signal needs to be connected to a large number of transistors involving large-scale capacitive loads, thus hampering quick operations. A short control signal means a short rising time and a short falling time. Furthermore, a high capacitive load leads to a longer rising time than necessary to extend the duration of the signal. Thus, to solve this problem, the inventors propose a new photoelectric hybrid circuit in which an optical signal is integrated with an electric signal.

Figure 9A:
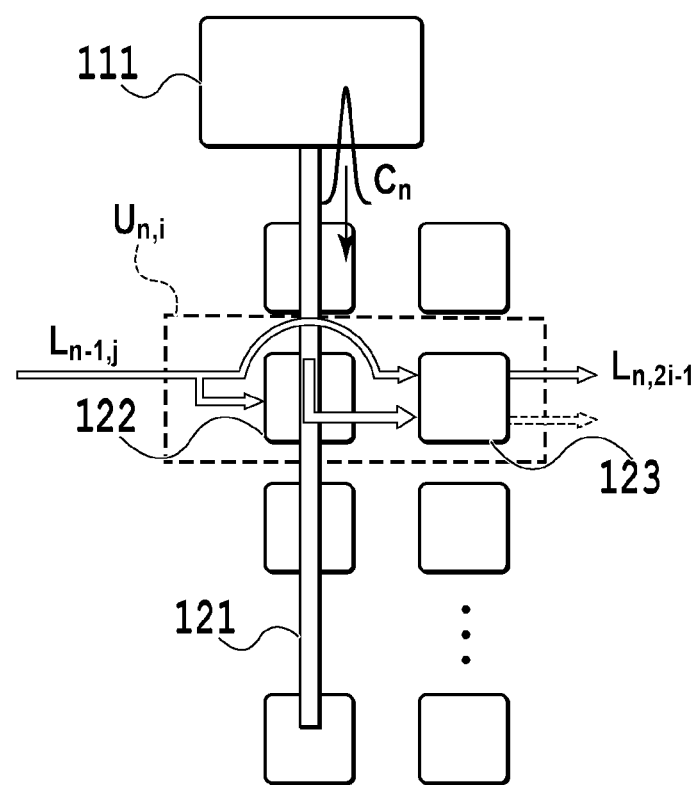
FIG. 9A is a diagram illustrating a configuration of a photoelectric hybrid circuit used as a determination unit in a recognition circuit according to an embodiment of the present invention.

At each determination stage S, instead of an electric signal from the serial-parallel converter 110, an optical pulse is used to control the determination units U. FIG. 9A and FIG.

Figure 9B:
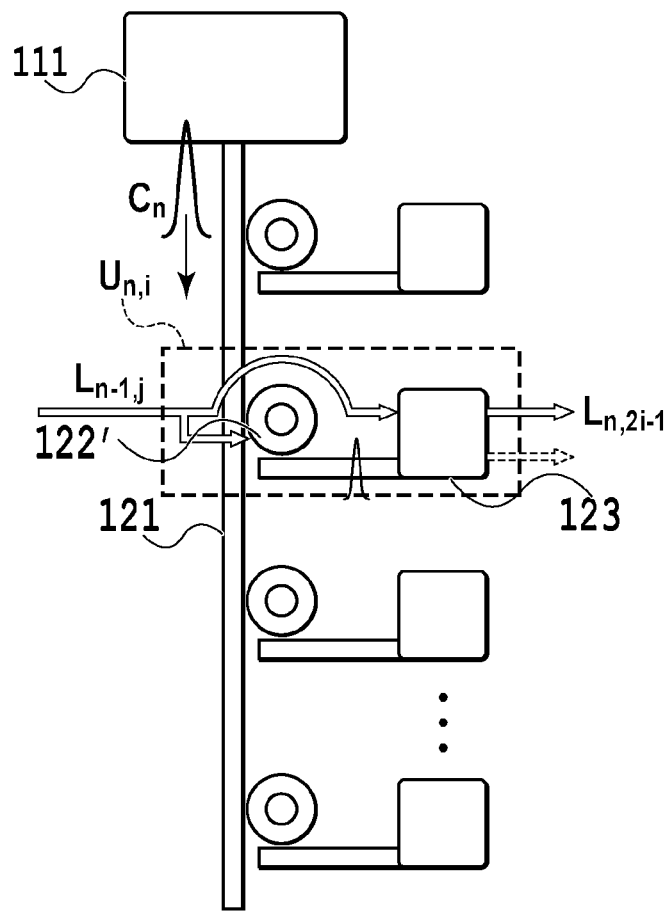
FIG. 9B is a diagram illustrating a configuration of a photoelectric hybrid circuit used as a determination unit in a recognition circuit according to an embodiment of the present invention.

9B illustrate a configuration of a photoelectric hybrid circuit used as a determination unit in a recognition circuit according to an embodiment of the present invention. FIG. 9A and FIG. 9B illustrate that the output from each conversion channel 111 of the serial-parallel converter 110 is connected to an optical waveguide 121 and that the optical waveguide 121 is disposed in proximity to rows of determination unit groups included in the determination stage S. The determination unit U is constituted of an optical resonator 122, 122' for drawing an optical pulse from the preceding determination stage S into the determination unit U through the optical waveguide 121 in accordance with the signal $L_{n-1,j}$ for activating the determination unit U, and a photoelectric hybrid logical circuit 123 determining which of two output ports is used to output an electric pulse in accordance with two input signals of the electric pulse and an optical pulse.

In a case where the converted bit signal is high, a control signal Cn that is an optical signal is generated to travel from the conversion channel 111 of the serial-parallel converter 110 toward the determination unit U of the determination stage S. On the other hand, no optical pulse is generated in a case where the converted bit signal is low.

As described above, the signal $L_{n-1,j}$ is still used to activate the determination unit $U_{n,1}$. However, instead of the control signals $C_n$ individually dealing with all the determination units U of the determination stage Sn including the determination unit $U_{n,i}$, a signal $L_{n-1,i}$ is used in the new configuration to deflect the control signal $C_n$ that is an optical pulse onto the determination unit U. The signal $L_{n-1,i}$ is branched to modulate the optical resonator circuit 122, 122' of the determination unit $U_{n,1}$ to deflect the control signal $C_n$ onto the determination unit $U_{n,i}$. An example of the optical resonator circuit 122, 122' is a high-speed modulating optical resonator such as an optical disc resonator or an optical ring resonator that has a small device size and that can operate with low energy (see NPL 1).

The photoelectric hybrid logical circuit 123 needs an optical receiver circuit generating an electric signal with controlled sustainability from the optical pulse deflected to the determination unit $U_{n,i}$. Various methods are available for generating such an electric signal, and for example, a discharge-based circuit including an MSM photodetector can be used to implement the method (see PTL 1). Moreover, a circuit can be implemented that generates an electric pulse using an input transistor similar to a transistor with an optical gate (see NPL 2). The photoelectric hybrid logical circuit 123 can be implemented by combining any of these optical receiver circuits converting an optical pulse into an electric pulse with a logical circuit determining which of the two output ports is used to output the electric pulse in accordance with two input signals of two electric pulses.

Embodiment 2

Figure 10A:
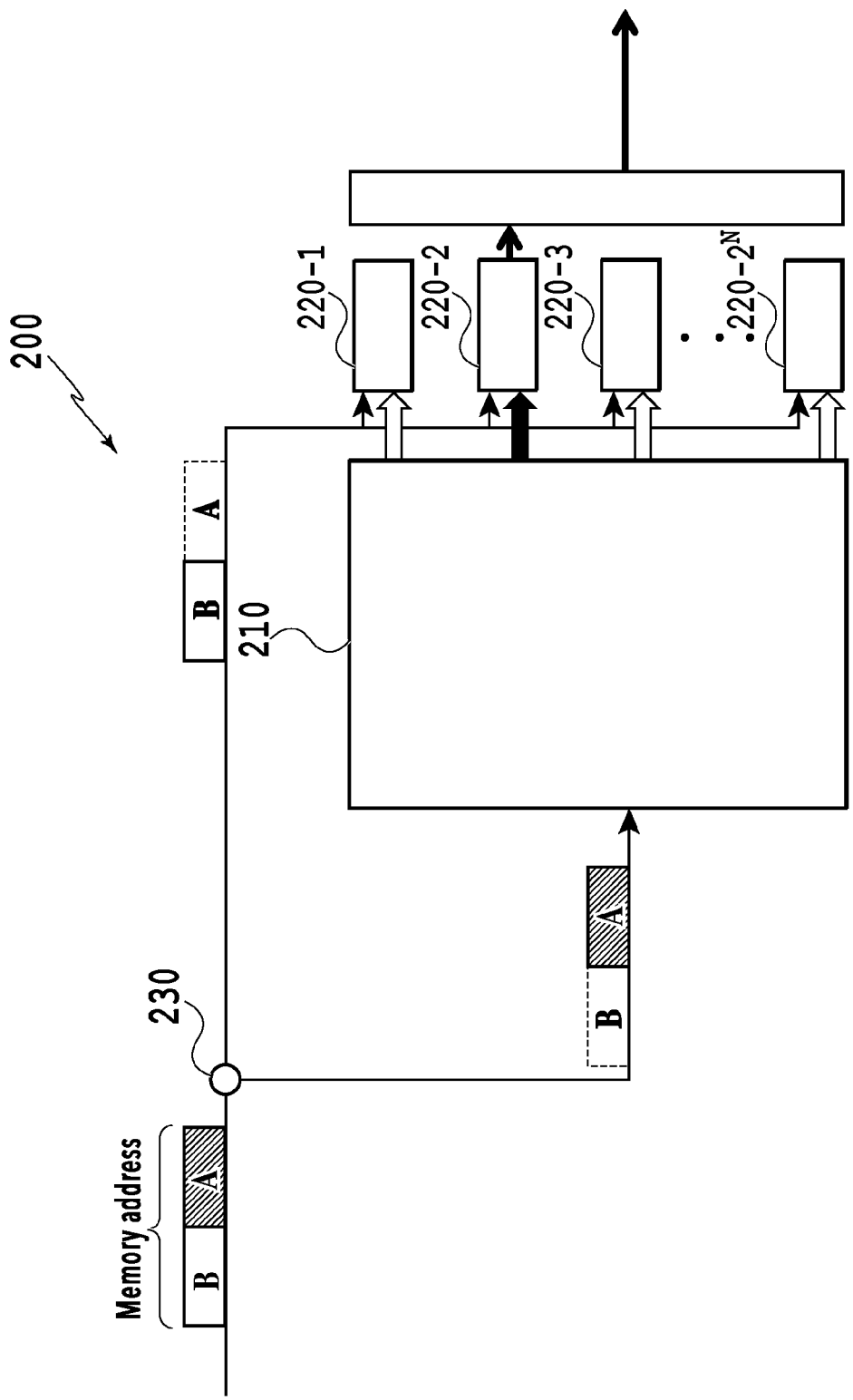
FIG. 10A is a diagram illustrating an example of a configuration in which a memory address signal is separated into portions using a switch of a large-scale distributed memory according to Embodiment 2 of the present invention.
Figure 10B:
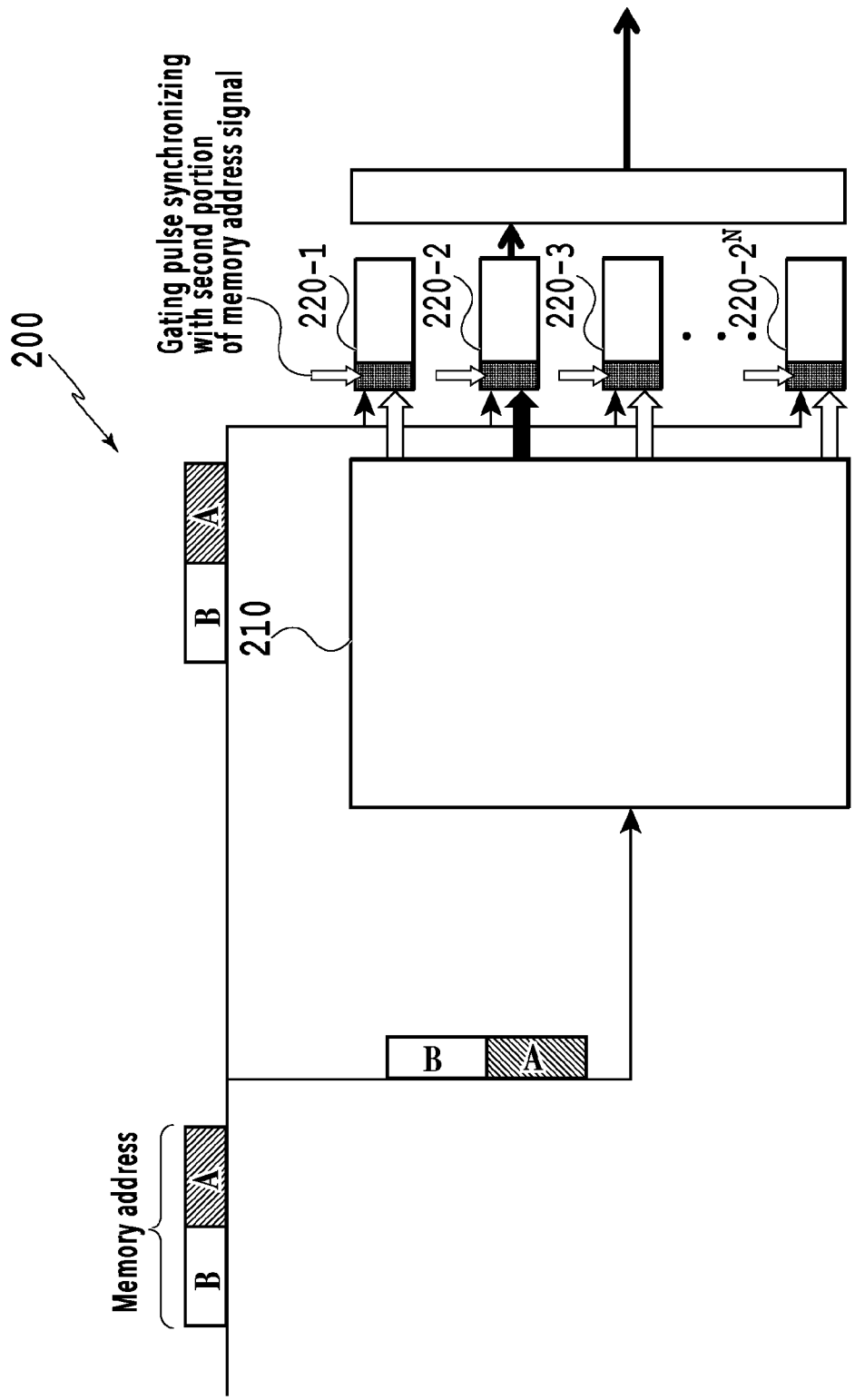
FIG. 10B is a diagram illustrating an example of a configuration in which an entire memory address signal is distributed using a splitter of the large-scale distributed memory according to Embodiment 2 of the present invention.

FIG. 10A and FIG. 10B illustrate a configuration of a large-scale distributed memory according to Embodiment 2 of the present invention. A large-scale distributed memory 200 includes a recognition circuit 210 that is the same as the recognition circuit 100 according to Embodiment 1 and known random access memory (RAM) chips 220-1 to 220-$2^N$ associated with respective output ports of the recognition circuit 210.

A memory address signal input to the large-scale distributed memory 200 includes two portions A, B as illustrated in FIGS. 10A, 10B. The first portion A is recognized by the recognition circuit 210, whereas the second portion B is recognized by each of the RAM chips. In a case where the first portion A of the memory address signal is input to the recognition circuit 210, a predetermined output port corresponding to the first portion A of the memory address signal turns to the High level state. The RAM chips 220-1 to 220-$2^N$ become active only in a case where the corresponding output port of the recognition circuit 210 turns to the High level to allow the second portion B to be loaded into the RAM chips. The second portion B of the memory address signal allows identification of a particular memory location in the RAM chip having become active as described above. Then, data stored at the memory location can be read or data can be written to the memory location.

Figure 11:
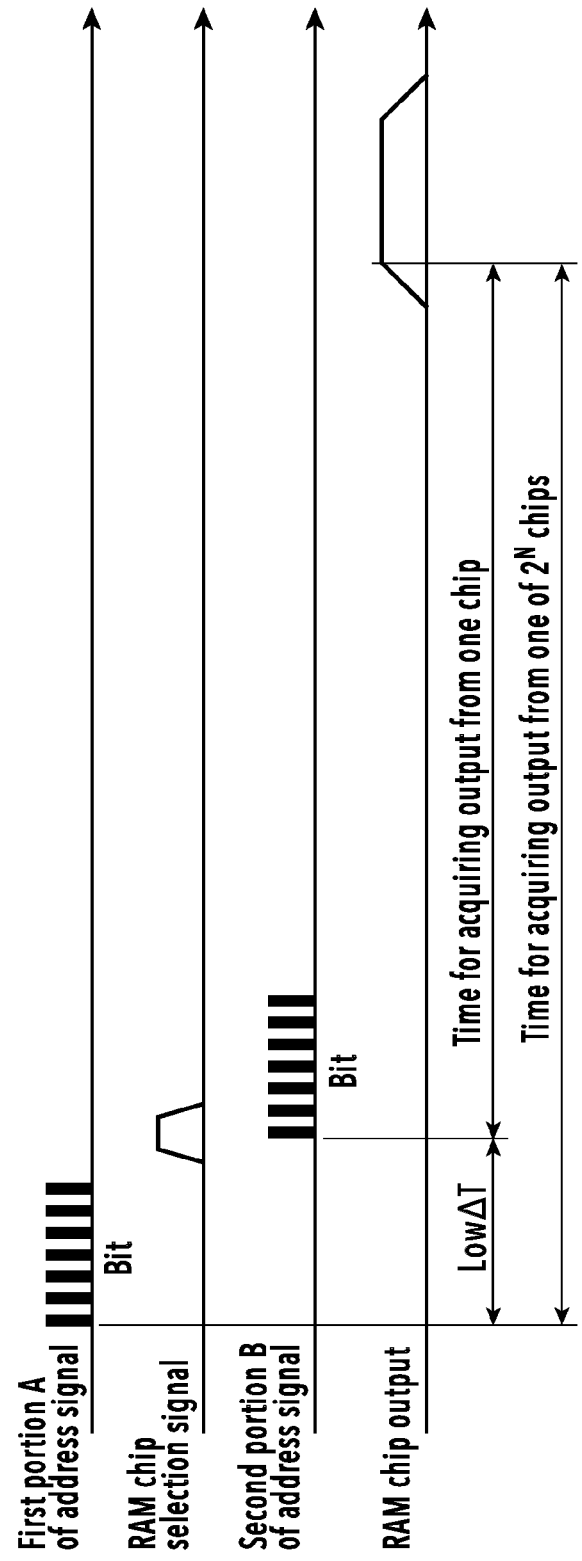
FIG. 11 is a time sequence diagram of a memory address signal and output signals from the recognition circuit and a RAM chip.

FIG. 11 illustrates a time sequence diagram of the memory address signal and the output signals from the recognition circuit and the RAM chip. In the large-scale distributed memory 200 according to the present Embodiment 2, as illustrated in FIG. 11, a time required for the recognition circuit 100 to select a particular RAM chip is only Low$\Delta$T longer than a time required for a configuration including one chip, and thus does not increase in proportion to the number of chips N. Accordingly, even a memory with a multi-dimensional array allows a particular RAM chip to be selected from a large number of RAM chips 220-1 to 220-$2^N$ at high speed. This enables a memory pool with high extensibility to be implemented without an increase in access time. This is beneficial for a wide range of data processing applications.

The output from the recognition circuit 210 in a real time mode suffers only a very short delay, and thus, the access time for the large-scale distributed memory 200 as a whole is substantially equal to the access time for each RAM chip. Furthermore, in a case where the recognition circuit 100 uses N bits, selection from $2^N$ RAM chips can be made. In a case where each RAM is assumed to have a bit capacity Q and an access time of T, the large-scale distributed memory 200 allows implementation of a memory pool having a maximum bit capacity of $2^N \times Q$ and an access time of T.

As described above, the method for designating a particular memory location using the first portion A and second portion B of the memory address signal typically includes the following two manners. In a first manner, the second portion B is distributed to all the RAM chips 220-1 to 220-$2^N$ to activate all of the RAM chips at the same time. Memory locations are thus designated in all the RAM chips 220-1 to 220-$2^N$. Then, the recognition circuit 210 is used to select a desired RAM chip 220-$i$ based on the first portion A. This manner activates even unwanted chips and thus involves high power consumption. In a second manner, in contrast to the first manner, first, the recognition circuit 210 is used to select one RAM chip 220-$i$. The second portion B is supplied only to the selected RAM chip 220-$i$ to designate a memory location. This manner avoids activating unwanted chips and is thus advantageous for reducing power consumption.

In the present invention, either manner may be applied, and the designation method need not limited to these manners.

The first portion A and the second portion B of the memory address signal need not necessarily be physically separated from each other. FIG. 10A illustrates an example in which a switch is used to separate the memory address signal into the two portions. FIG. 10B illustrates an example in which a splitter is used to distribute the entire memory address signal. In FIG. 10A, the first portion A and the second portion B resulting from separation using the switch 230 are distributed to the recognition circuit 100 and the RAM chips 220-1 to 220-$2^N$. In FIG. 10B, the entire memory address signal is distributed both to the recognition circuit 100 and to the RAM chips 220-1 to 220-$2^N$ through the splitter. In this case, the recognition circuit 210 is designed to react only to the first N bits corresponding to the first portion A and to neglect the remaining bits. An electric gate pulse signal synchronizing with the second portion B is input to the RAM chips 220-1 to 220-$2^N$, and is used to execute, for example, a process of masking the first portion A. This allows only the second portion B to be recognized.

Embodiment 3

Figure 12:
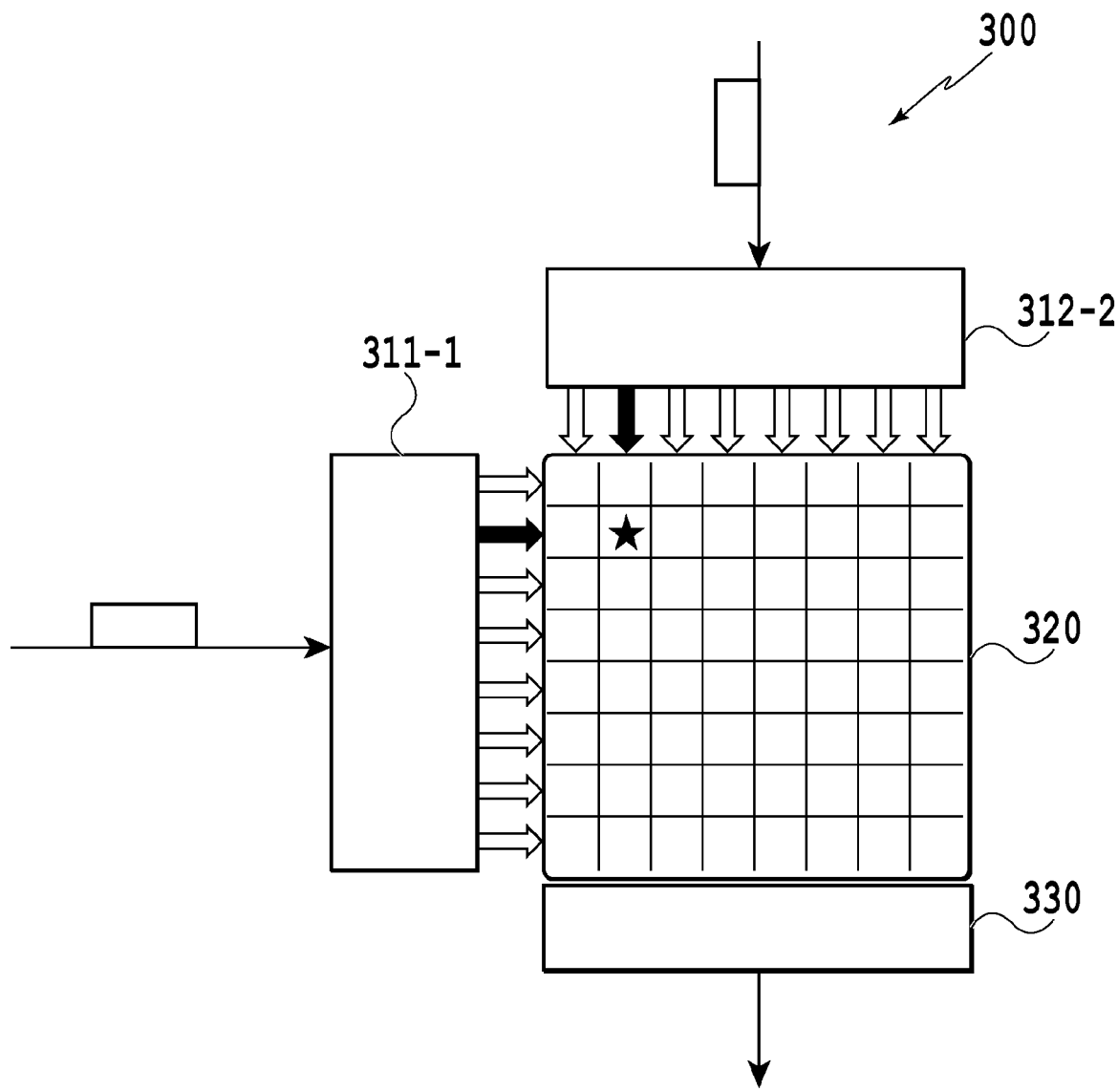
FIG. 12 is a diagram illustrating a configuration of an ultrahigh-speed Read Only Memory (ROM) chip with ultrahigh-speed access according to Embodiment 3 of the present invention.

FIG. 12 illustrates a configuration of an ultrahigh-speed Read Only Memory (ROM) according to Embodiment 3 of the present invention. The ultrahigh-speed ROM chip 300 includes a line decoder 311 and a word decoder 312 each including the recognition circuit 100 used in the present embodiment 1, a two-dimensional memory cell array 320, and an output sensor 330.

In a case where an input address signal is input to the line decoder 311 and the word decoder 312, the input address signal is decoded to designate the location of a memory cell in the memory cell array 320 to be made active. Data stored in the designated memory cell is output from the output sensor 330.

In known electronic decoders, an increased memory cell array size and thus an increased number of cells reduce the speed of the electronic decoder. Thus, the access speed for known ROM chips decreases with increasing memory array size and thus storage capacity. As an ultrahigh-speed ROM chip preventing a decrease in access speed resulting from such an increase in storage capacity to enable operations using a sub-nanosecond access time, a decoder made of a superconducting material has been proposed (see NPL 3). However, to allow the ultrahigh-speed RPM chips to operate using the sub-nanosecond access time, the decoders need to be cooled down to a very low temperature.

In contrast, an ultrahigh-speed ROM 300 according to the present Embodiment 3 of the present invention uses, in the line decoder 311 and the word decoder 312, the recognition circuit 100 used in the present Embodiment 1. Thus, even with an increased size of the memory cell array 320 and thus an increased number of memory cells, the ultrahigh-speed ROM 300 can operate using an access time of sub-nanoseconds at room temperature.

Embodiment 4

FIG. 13 illustrates a configuration of a high-performance digital analog converter (DAC) according to Embodiment 4 of the present invention. A DAC 400 includes a recognition circuit 410 that is the same as the recognition circuit 100 used in the present Embodiment 1, and an analog output voltage generator 420. The DAC 400 operate in real time, and consecutive input signals are separated into a plurality of words. Each of the words is converted into a corresponding analog output voltage. Each word is constituted of M bits, and an output voltage at a $2^M$ level is supported by DAC chips.

The analog output voltage generator 420 includes an input port controlling generation of a voltage at each output voltage level. Output ports of the recognition circuit 410 are associated with respective input ports of the analog output voltage generator 420. In a case where a particular output port of the recognition circuit 410 turns to the High level, a particular input port of the analog output voltage generator 420 associated with the output port becomes active. A voltage at a predetermined output voltage level is generated in the analog output generator 420, which outputs the voltage.

A known DAC constituted only of an electronic circuit is difficult to configure such that each word includes more than 6 bits. However, the present Embodiment 4 can be configured such that each bit includes 6 or more bits. A process of recognizing an input word pattern in the DAC 400 in the present Embodiment 4 is executed by the recognition circuit 410 used in Embodiment 1. The process is separated from a process of generating a corresponding analog output voltage. Thus, in the present embodiment, the input word pattern can be recognized more quickly than in the related art. Thus, words each including more bits than in the related art can be converted in real time.

Furthermore, in a case where an optical clock signal is used to control an interface between the output from the recognition circuit 410 and the analog output voltage generator 420, jitter resulting from high-speed operation using an electronic clock signal can be removed. An accurate output waveform can also be obtained that includes a rapid rising waveform and a rapid falling waveform (PTL 1 and NPL 3).

REFERENCE SIGNS LIST

1 Input optical waveguide
2, 110 Serial-parallel converter
3 Delay circuit
4, 200 Logical circuit
100 Recognition circuit
111 Conversion channel
120 Determination circuit
121 Optical waveguide
122 Optical resonator circuit
123 Photoelectric hybrid logical circuit
210, 410 Recognition circuit
220 RAM chip
311 Line decoder
312 Word decoder
320 Memory cell array
330 Output sensor
420 Analog output voltage generator

The invention claimed is:

1. A signal processing circuit comprising:
one serial port to which an N-bit input word is input;
$2^N$ first output ports corresponding uniquely to $2^N$ bit combinations and spatially separated from one another; and
a recognition circuit for outputting, through one of the first output ports, an output corresponding to each word of the input words, wherein the recognition circuit includes:
a serial-parallel converter configured to generate and output, for each bit of the input word, an optical pulse being a control signal indicative of a state of the bit,
determination stages corresponding to the respective bits of the input word input through the serial port, each determination stage including a determination unit configured to output, in a case where an electric pulse is input to the determination unit to activate the determination unit, the electric pulse to one of two second output ports according to the optical pulse indicative of a state of a corresponding bit of the input word, wherein, in the determination units corresponding to the lowest bit, a duration of an output electric pulse is set, for each of the output ports of the determination units, to have a predetermined temporal overlap with a predetermined observation period,
wherein the two second output ports of the determination unit being connected to different determination units corresponding to an adjacent lower bit, the second output ports of the determination units corresponding to a lowest bit of the input word being connected to the first output ports.

2. The signal processing circuit according to claim 1, and the determination unit includes:
an optical resonance circuit configured to modulate the optical pulse by the electric pulse output from the determination unit corresponding to a higher bit and then deflect the optical pulse;
an optical receiver circuit configured to generate a second electric pulse from the optical pulse deflected by the optical resonance circuit; and
a logical circuit configured to determine the second output port outputting the electric pulse, based on the second electric pulse output from the optical receiver circuit.

3. The signal processing circuit according to claim 2, wherein the optical resonator circuit has a vertical-junction microdisk structure.

4. The signal processing circuit according to claim 2, wherein the optical receiver circuit is a discharge-based circuit including an MSM photodetector.

5. A distributed memory comprising:
a signal processing circuit including
one serial port to which an N-bit word is input,
$2^N$ first output ports corresponding uniquely to $2^N$ bit combinations and spatially separated from one another, and
a recognition circuit including determination stages corresponding to the respective bits of the input word input through the serial port, wherein the recognition circuit further includes a serial-parallel converter configured to generate and output, for each bit of the input word, an optical pulse being a control signal indicative of a state of the bit, the determination stages each including a determination unit configured to output, in a case where an electric pulse is input to the determination unit to activate the determination unit, the electric pulse to one of two second output ports according to the optical pulse indicative of a state of a corresponding bit of the input word, the two second output ports of the determination unit being connected to different determination units corresponding to an adjacent lower bit, the second output ports of the determination units corresponding to a lowest bit of the input word being connected to the first output ports;
$2^N$ RAM chips corresponding uniquely to the $2^N$ first output ports of the signal processing circuit and made active only in a case where an electric pulse is output from the first output port;
wherein an input address signal includes a first portion of N bits and a second portion of M bits, the signal processing circuit recognizes the first portion and the $2^N$ RAM chips recognize the second portion.

6. The distributed memory according to claim 5, wherein the first portion and the second portion of the input address signal are separated from each other, the first portion is input to the signal processing circuit, and the second portion is input to the $2^N$ RAM chips.

7. The distributed memory according to claim 5, wherein the input address signal is input both to the signal processing circuit and to the $2^N$ RAM chips, the signal processing circuit recognizes only the first portion of the input address signal, and
the $2^N$ RAM chips recognize only the second portion of the input address signal using a gate pulse signal synchronizing with the second portion of the input address signal.

8. A ROM comprising:
a first decoder and a second decoder each including a signal processing circuit and configured to decode a memory address from an input address signal, the signal processing circuit including
one serial port to which an N-bit word is input,
$2^N$ first output ports corresponding uniquely to $2^N$ bit combinations and spatially separated from one another, and
a recognition circuit including determination stages corresponding to the respective bits of the input word input through the serial port, wherein the recognition circuit further includes a serial-parallel converter configured to generate and output, for each bit of the input word, an optical pulse being a control signal indicative of a state of the bit, the determination stages each including a determination unit configured to output, in a case where an electric pulse is input to the determination unit to activate the determination unit, the electric pulse to one of two second output ports according to the optical pulse indicative of a state of a corresponding bit of the input word, two second output ports of the determination unit being connected to different determination units corresponding to an adjacent lower bit, the second output ports of the determination units corresponding to a lowest bit of the input word being connected to the first output ports;
a memory cell array connected to the first and second decoders and including a plurality of two-dimensionally arranged memory cells corresponding to the memory address decoded; and
an output sensor connected to each of the memory cells of the memory cell array and configured to output data from a memory cell designated by the first and second decoder.

9. A DAC comprising:
a signal processing circuit including
one serial port to which an N-bit word is input,
$2^N$ first output ports corresponding uniquely to $2^N$ bit combinations and spatially separated from one another, and
a recognition circuit including determination stages corresponding to the respective bits of the input word input through the serial port, wherein the recognition circuit further includes a serial-parallel converter configured to generate and output, for each bit of the input word, an optical pulse being a control signal indicative of a state of the bit, the determination stages each including a determination unit configured to output, in a case where an electric pulse is input to the determination unit to activate the determination unit, the electric pulse to one of two second output ports according to the optical pulse indicative of a state of a corresponding bit of the input word, the two second output ports of the determination unit being connected to different determination units corresponding to an adjacent lower bit, the second output ports of the determination units corresponding to a lowest bit of the input word being connected to the first output ports; and an analog output voltage generator including $2^N$ input ports corresponding uniquely to the $2^N$ first output ports of the signal processing circuit, the $2^N$ input ports controlling generation of voltages at $2^N$ output voltage levels and causing the analog output voltage generator to generate a voltage at a predetermined voltage level only in a case where an electric pulse is output from the first output ports.

* * * * *